(12) United States Patent
Sasaki

(10) Patent No.: US 7,323,807 B2
(45) Date of Patent: Jan. 29, 2008

(54) MULTILAYER ELECTRONIC COMPONENT

(75) Inventor: Satoshi Sasaki, Akita (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/126,334

(22) Filed: May 11, 2005

(65) Prior Publication Data
US 2005/0274543 A1    Dec. 15, 2005

(30) Foreign Application Priority Data
May 25, 2004   (JP)   .......................... P2004-155124

(51) Int. Cl.
*H01L 41/047*   (2006.01)
*H01L 41/083*   (2006.01)
(52) U.S. Cl. ..................... 310/366; 310/365
(58) Field of Classification Search ............ 310/366, 310/332, 364, 365
See application file for complete search history.

(56) References Cited

U.S. PATENT DOCUMENTS 5,381,385 A * 1/1995 Greenstein ................. 367/140
6,291,932 B1 * 9/2001 Maruyama et al. ......... 310/366
6,559,574 B2 * 5/2003 Maruyama ............. 310/323.02
6,864,620 B2 * 3/2005 Takeuchi et al. ............ 310/334
6,986,189 B2 * 1/2006 Kitahara .................... 29/25.35

FOREIGN PATENT DOCUMENTS

JP    A 2000-261055    9/2000

* cited by examiner

*Primary Examiner*—Darren Schuberg
*Assistant Examiner*—Derek Rosenau
(74) *Attorney, Agent, or Firm*—Oliff & Berridge, PLC

(57) ABSTRACT

A multilayer electronic component comprises a plurality of matrix layers and a plurality of inner electrodes. The matrix layers and inner electrodes are alternately laminated. The plurality of inner electrodes include first electrodes and second electrodes opposing the first electrode while alternating with the matrix layers. Each matrix layer is formed with a plurality of first through hole electrodes for electrically connecting different first electrodes to each other, and a plurality of second through hole electrodes for electrically connecting different second electrodes to each other.

9 Claims, 4 Drawing Sheets

MULTILAYER ELECTRONIC COMPONENT

BACKGROUND OF THE INVENTION

1. Field of the Invention

The present invention relates to a multilayer electronic component.

2. Related Background Art

Known as an example of conventional multilayer electronic components is a multilayer piezoelectric element disclosed in Japanese Patent Application Laid-Open No. 2000-261055. The multilayer piezoelectric element disclosed in Japanese Patent Application Laid-Open No. 2000-261055 includes a piezoelectric ceramic body formed by laminating a plurality of piezoelectric ceramic green sheets printed with inner electrodes, whereas the piezoelectric ceramic body is formed with two via holes penetrating through the inner electrodes. Conductor leads for electrically connecting the vertically alternating inner electrodes are disposed within the via holes.

SUMMARY OF THE INVENTION

In the prior art mentioned above, the inner electrodes of the same polarity alternating with the other layers are connected together with only one conductor lead disposed on one end side of the piezoelectric ceramic body. Therefore, when a voltage is applied between a positive inner electrode and a negative inner electrode, there is a possibility of biasing the distribution of current flowing through the inner electrodes, thereby yielding an uneven electric field distribution between the inner electrodes. When the electric field distribution occurring between the inner electrodes becomes uneven, the displacement amount distribution in the piezoelectric ceramic body may fluctuate, thus leaving a fear of failing to attain the amount of displacement originally supposed to be required.

It is an object of the present invention to provide a multilayer electronic component which can improve the uniformity in the electric field distribution occurring between the inner electrodes.

The present invention provides a multilayer electronic component constructed by alternately laminating a matrix layer and an inner electrode; wherein the multilayer electronic component includes a plurality of matrix layers and a plurality of inner electrodes; wherein the plurality of inner electrodes include a first electrode and a second electrode opposing the first electrode with the matrix layer interposed therebetween; and wherein each of the matrix layers is formed with a plurality of first through hole electrodes for electrically connecting different first electrodes to each other and a plurality of second through hole electrodes for electrically connecting different second electrodes to each other.

In the multilayer electronic component in accordance with the present invention, for example, a plurality of first through hole electrodes are formed separately from each other on each matrix layer, whereas a plurality of second through hole electrodes are formed separately from each other on each matrix layer, whereby the bias in current distribution occurring in the first and second electrodes when a voltage is applied therebetween can be reduced. In this case, the electric field occurring between the first and second electrodes is rapidly spread over the whole component in a uniform fashion, whereby the uniformity in electric field distribution improves. Hence, when a voltage is applied between the first and second electrodes, the uniformity in electric field distribution occurring in piezoelectric layers between the electrodes improves, which can restrain the multilayer electronic component from deteriorating its performances. When a plurality of first through hole electrodes and a plurality of second through hole electrodes are provided, the deterioration in performances of the multilayer electronic component can be minimized even if one of the through hole electrodes is broken. When the multilayer electronic component of the present invention is used as a multilayer piezoelectric element, the uniformity in amount of displacement of the matrix layers can be improved.

Preferably, the plurality of first through hole electrodes are formed in the matrix layer so as to hold a center of the matrix layer therebetween, whereas the plurality of second through hole electrodes are formed in the matrix layer so as to hold the center of the matrix layer therebetween at respective positions different from the first through hole electrodes. When a voltage is applied between the first and second electrodes in this case, the electric field occurring between the electrodes spreads substantially uniformly about the center of the matrix layer. This further improves the uniformity of electric field distribution.

Preferably, the plurality of matrix layers include first and second matrix layers alternately laminated with the inner electrodes interposed therebetween; the first matrix layer includes a first electrode forming region having a surface formed with the first electrode and the first through hole electrodes formed therein, and a plurality of first connection regions respectively formed with the second through hole electrodes; and the second matrix layer includes a second electrode forming region having a surface formed with the second electrode and the second through hole electrodes formed therein, and a plurality of second connection regions respectively formed with the first through hole electrodes.

In this case, the first and second through hole electrodes are formed in regions other than the region where the first and second electrodes overlap within the matrix layers. When the multilayer electronic component is used as a multilayer piezoelectric element, the region where the first and second electrodes overlap becomes a piezoelectrically active region which displaces the matrix layers when a voltage is applied between the first and second electrodes. On the other hand, the regions (regions other than the piezoelectrically active region) formed with the first and second through hole electrodes are regions hardly involved in the displacement of the matrix layers. Therefore, these through hole electrodes themselves hardly inhibit the matrix layers from being displaced, and thus can increase the amount of displacement of the matrix layers. The first and second through hole electrodes are not formed in the piezoelectrically active region, and thus can reliably be prevented from breaking when the multilayer piezoelectric element is driven (displaced).

More preferably, the first through hole electrodes formed in the first electrode forming region are located at portions corresponding to the plurality of second connection regions, whereas the second through hole electrodes formed in the second electrode forming region are located at portions corresponding to the plurality of first connection regions. This can reduce the space for the first and second connection regions and increase the space for the first and second electrode forming regions. Therefore, when the multilayer electronic component is used as a multilayer piezoelectric element, the space for the piezoelectrically active region can be increased, by which the amount of displacement of the matrix layers can be made greater in proportion.

Preferably, the plurality of first connection regions are provided in the first matrix layer so as to hold the first electrode forming region therebetween, whereas the plurality of second connection regions are provided in the second matrix layer so as to hold the second electrode forming region therebetween at a position different from the first connection regions. When a voltage is applied between the first and second electrodes in this case, the electric field occurring between the electrodes spreads substantially uniformly from the end portion side of the electrodes toward the center thereof. As a consequence, the action of enhancing the uniformity in the electric field distribution can be exhibited effectively.

Preferably, a first connecting pattern electrically connected to the second through hole electrode is formed on the surface of each first connection region in the first matrix layer, whereas a second connecting pattern electrically connected to the first through hole electrode is formed on the surface of each second connection region in the second matrix layer. This makes it possible to connect a number of first electrodes to each other easily and reliably by way of a plurality of first through hole electrodes and second connecting patterns. Also, a number of second electrodes can be connected to each other easily and reliably by way of a plurality of second through hole electrodes and first connecting patterns. Therefore, even when the number of matrix layers is large, the reliability concerning the connection of inner electrodes can be improved.

Preferably, the first electrode forming region and first connection regions are formed on the inside of a periphery of the first matrix layer, whereas the second electrode forming region and second connection regions are formed on the inside of a periphery of the second matrix layer. This keeps the inner electrodes from being exposed to the peripheries of the matrix layers. Therefore, in the case where the multilayer electronic component is used as a multilayer piezoelectric element, cracks can be prevented from occurring at interfaces between the matrix layers and inner electrodes even when the multilayer piezoelectric element is continuously driven (displaced). This can also prevent metals and metal ions from migrating because of the moisture attached to side faces of the multilayer piezoelectric element when the multilayer piezoelectric element is driven in a humid atmosphere in particular.

Preferably, the first electrode forming region has an area greater than the total area of the plurality of first connection regions, whereas the second electrode forming region has an area greater than the total area of the plurality of second connection regions. This can effectively form the piezoelectrically active region when the multilayer electronic component is used as a multilayer piezoelectric element.

More preferably, the plurality of first connection regions are formed at an end portion of the first matrix layer, whereas the plurality of second connection regions are formed at an end portion of the second matrix layer. In general, end portions of matrix layers are portions which are particularly less susceptible to displacements of the matrix layers. Therefore, forming the end portion of the first matrix layer with the first connection region and forming the end portion of the second matrix layer with the second connection region can yield the piezoelectrically active region more effectively. This can more reliably prevent the through hole electrodes from breaking at the time when the multilayer piezoelectric element is driven.

Preferably, the matrix layer has a quadrangular form, the plurality of first through hole electrodes are formed at one pair of corners of the matrix layer opposing each other by way of the center of the matrix layer, and the plurality of second through hole electrodes are formed at the other pair of corners opposing each other by way of the center of the matrix layer. This makes it possible to form a sufficiently large region where the first and second electrodes overlap each other without including the first and second through hole electrodes. Therefore, when the multilayer electronic component is used as a multilayer piezoelectric element, a large space can be reserved for the piezoelectrically active region, while the first and second through hole electrodes hardly inhibit the matrix layer from being displaced. This can increase the amount of displacement of the matrix layer. The first and second through hole electrodes themselves are not displaced, whereby the through hole electrodes can reliably be prevented from breaking at the time when the multilayer piezoelectric element is driven (displaced).

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the present invention will be explained in detail with reference to the accompanying drawings. In the explanation, constituents identical to each other or those having functions identical to each other will be referred to with numerals identical to each other without repeating their overlapping descriptions.

Figure 1:
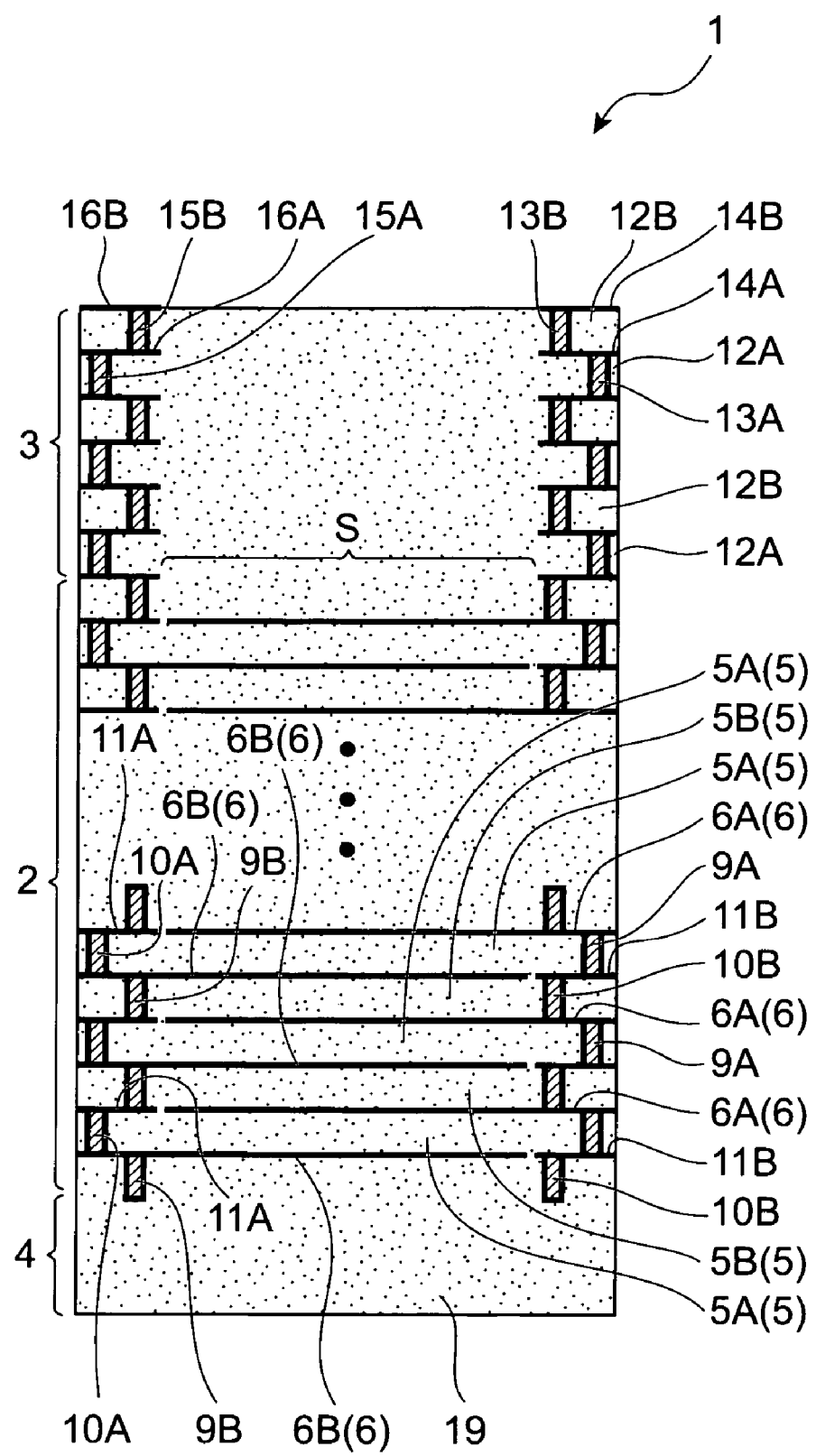
FIG. 1 is a vertical sectional view showing the multilayer piezoelectric element in accordance with an embodiment.

FIG. 1 is a vertical sectional view showing one embodiment of the multilayer electronic component in accordance with the present invention. In this drawing, the multilayer electronic component in accordance with this embodiment is a multilayer piezoelectric element shaped like a quadratic prism. The multilayer piezoelectric element 1 comprises a piezoelectric element main part 2, an upper lid part 3 disposed on the upper side of the piezoelectric element main part 2, and a lower lid part 4 disposed on the lower side of the piezoelectric element main part 2.

The piezoelectric element main part 2 is constructed by alternately laminating piezoelectric layers 5 which are matrix layers and inner electrodes 6. There are a plurality of piezoelectric layers 5 and a plurality of inner electrodes 6. The plurality of piezoelectric layers 5 include piezoelectric layers 5A, 5B. The piezoelectric layers 5A, 5B are alternately laminated with the inner electrodes 6 respectively interposed therebetween. The piezoelectric layers 5A, 5B are formed from a piezoelectric ceramic material mainly composed of PZT (lead zirconate titanate), for example.

The plurality of inner electrodes 6 include electrodes 6A, 6B. The electrodes 6A, 6B are alternately laminated with the piezoelectric layers 5 interposed therebetween. One of the electrodes 6A, 6B constitutes a positive electrode layer, whereas the other constitutes a negative electrode layer. The electrodes 6A, 6B are made of a metal material in which the ratio of Ag:Pd=7:3, for example. As the metal material forming the electrodes 6A, 6B, not only Ag and Pd, but also Au, Pt, and their alloys may be used.

Figure 2:
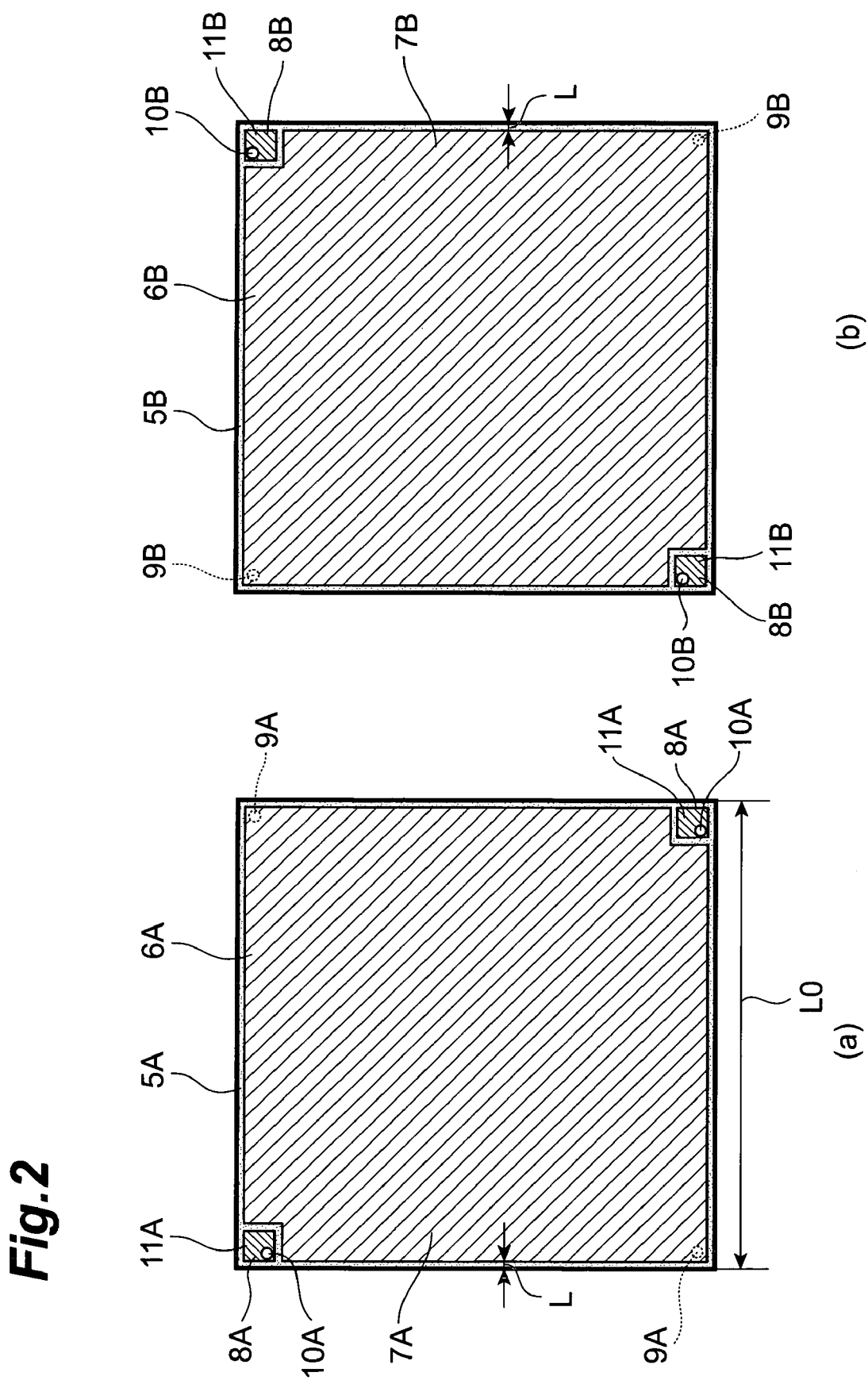
FIG. 2 is a horizontal sectional view of the piezoelectric element main part shown in FIG. 1.

As shown in FIG. 2, the piezoelectric layers 5A, 5B have a quadrangular (square) form. The piezoelectric layers 5A, 5B have a size of 7.5 mm (length)×7.5 mm (width)×80 µm (thickness), for example.

As shown in (a) in FIG. 2, the piezoelectric layer 5A includes an electrode forming region 7A and two connection regions 8A formed so as to oppose each other across the electrode forming region 7A. The connection regions 8A are formed at one pair of corners of the piezoelectric layer 5A opposing each other while holding therebetween the center of the piezoelectric layer 5A.

An electrode 6A is formed on the surface of the electrode forming region 7A. Formed in the electrode forming region 7A are two circular through hole electrodes 9A for electrically connecting the upper and lower electrodes 6A, which are laminated alternately therewith, to each other. The through hole electrodes 9A are formed at the other pair of corners of the piezoelectric layer 5A opposing each other while holding therebetween the center of the piezoelectric layer 5A. The connection regions 8A are formed with respective circular through hole electrodes 10A for electrically connecting the upper and lower electrodes 6B, which are laminated alternately therewith, to each other. The surface of each connection region 8A is formed with a quadrangular connecting pattern 11A electrically connected to the through hole electrode 10A. The size of the connecting pattern 11A is 150 µm×150 µm, for example. The connecting pattern 11A is not electrically connected to the electrode 6A.

The through hole electrodes 9A, 10A are formed by filling through holes in the piezoelectric layer 5A with a conductive material. As with the electrode 6A, the conductive material is a metal material in which the ratio of Ag:Pd=7:3. Not only Ag and Pd, but also Au, Pt, and their alloys may be used as the conductive material. Each of the through hole electrodes 9A, 10A has a diameter of about 50 µm, for example.

The electrode forming region 7A and connection regions 8A are formed on the inside of the periphery of the piezoelectric layer 5A. This keeps the electrode 6A and connecting patterns 11A from being exposed to the periphery of the piezoelectric layer 5A. Here, the ratio ($L/L_0$) between the distance (insulation gap) L from the periphery of the piezoelectric layer 5A to the electrode forming region and each connection region 8A and the length $L_0$ of one side of the upper and lower faces of the piezoelectric layer 5A is preferably at least 0% but not greater than 3%, more preferably 0.2% to 1.0%.

The area of the electrode forming region 7A is greater than the total area of the connection regions 8A. Here, the ratio ($S_2/S_1$) between the area $S_1$ of the electrode forming region 7A and the total area $S_2$ of the connection regions 8A is preferably 1% or less, more preferably 0.5% or less.

As shown in (b) in FIG. 2, the piezoelectric layer 5B includes an electrode forming region 7B and two connection regions 8B formed so as to oppose each other across the electrode forming region 7B. The connection regions 8B are formed at one pair of corners of the piezoelectric layer 5B different from the corners corresponding to the portions where the connection regions 8A are formed.

An electrode 6B is formed on the surface of the electrode forming region 7B. Formed in the electrode forming region 7B are two circular through hole electrodes 9B for electrically connecting the upper and lower electrodes 6B, which are laminated alternately therewith, to each other. The through hole electrodes 9B are formed at a pair of corners corresponding to the respective portions where the connection regions 8A are formed. Here, the through hole electrodes 9B are formed at respective positions shifted from the through hole electrodes 10A in the connection regions 8A.

Formed in each connection region 8B is a circular through hole electrode 10B for electrically connecting the upper and lower electrodes 6A, which are laminated alternately therewith, to each other. Here, the through hole electrodes 10B are formed at positions shifted from the through hole electrodes 9A. The surface of each connection region 8B is formed with a connecting pattern 11B electrically connected to the through hole electrode 10B. The connecting pattern 11B is not electrically connected to the electrode 6B. The through hole electrodes 9B, 10B are the same as the through hole electrodes 9A, 10A in terms of structure, size, and the like, whereas the connecting pattern 11B is the same as the connecting pattern 11A in terms of structure, size, and the like.

As with the electrode forming region 7A and connection regions 8A, the electrode forming region 7B and connection regions 8B are formed on the inside of the periphery of the piezoelectric layer 5B. Here, the ratio of the insulation gap L of the electrode forming region 7B and connection regions 8B and the relationship between the area of the electrode forming region 7B and the total area of the connection regions 8B are the same as those in the electrode forming region 7A and connection regions 8A.

In the state where piezoelectric layers 5A each formed with the electrode 6A and piezoelectric layers 5B each formed with the electrode 6B are alternately laminated, as shown in FIG. 1, a plurality of electrodes 6A are electrically connected to each other by way of the through hole electrodes 9A, connecting patterns 11B, and through hole electrodes 10B, whereas a plurality of electrodes 6B are electrically connected to each other by way of the through hole electrodes 9B, connecting patterns 11A, and through hole electrodes 10A.

In the state where piezoelectric layers 5A and 5B are alternately laminated, the through hole electrodes 9A, 10B are arranged in a staggered manner with respect to the laminating direction of the piezoelectric layers 5A, 5B, since the through hole electrodes 9A, 10B are arranged at respective positions shifted from each other as mentioned above. The through hole electrodes 9B, 10A are arranged in a staggered manner with respect to the laminating direction of the piezoelectric layers 5A, 5B, since the through hole electrodes 9B, 10A are arranged at respective positions shifted from each other as mentioned above. Therefore, even when a number of piezoelectric layers 5A, 5B are laminated, it is possible to reliably connect the upper and lower electrodes 6A to each other and the upper and lower electrodes 6B to each other without performing complicated alignment of the through hole electrodes 9A to 10B.

In the foregoing piezoelectric element main part 2, the region S where the electrodes 6A, 6B overlap each other forms a piezoelectrically active region where the piezoelectric layers 5A, 5B are displaced when a voltage is applied between the electrodes 6A, 6B. The through hole electrodes 9A, 10A are formed at four corners of the piezoelectric layer 5A, whereas the through hole electrodes 9B, 10B are formed at four corners of the piezoelectric layer 5B. The insulation gaps of the electrodes 6A, 6B from the peripheries of the piezoelectric layers 5A, 5B are sufficiently small, whereas the areas of the electrodes 6A, 6B are sufficiently greater than those of the electrodes 6A, 6B. As a consequence, a large piezoelectrically active region S is formed in terms of space. The through hole electrodes 9A to 10B are formed in regions other than the piezoelectrically active region S, so that the through hole electrodes 9A to 10B themselves are not displaced. Therefore, the through hole electrodes 9A to 10B hardly inhibit the piezoelectric layers 5A, 5B from being displaced. Hence, a sufficient amount of displacement can be obtained in the piezoelectric layers 5A, 5B.

The electrodes 6A are electrically connected to each other by way of two sets of through hole electrodes 9A, 10B, whereas the electrodes 6B are electrically connected to each other by way of two sets of through hole electrodes 9B, 10A. This reduces the fluctuation in distribution of current flowing through the electrodes 6A, 6B when a voltage is applied therebetween, thereby improving the in-plane uniformity of the electric field (voltage) distribution occurring in the piezoelectric layer 5 between the electrodes 6A, 6B. Namely, electric fields uniformly spread from a pair of corners of the piezoelectric layer to the center thereof, whereby the electric field distribution occurring in the piezoelectric layer 5 becomes substantially uniform as a whole faster than in the case where only one set each of through hole electrodes connect electrodes 6A to each other and the electrodes 6B to each other. This enhances the in-plane uniformity in the amount of displacement of the piezoelectric layer 5.

The through hole electrodes 9A to 10B are formed at corners of the piezoelectric layer 5 which are the least susceptible to the displacement of the piezoelectric layer 5. This can prevent the displacement of the piezoelectric layer 5 from breaking and destroying the through hole electrodes 9A to 10B.

Since the inner electrodes 6 are not exposed to the peripheries of the piezoelectric layers 5, no cracks are easy to occur at interfaces between the inner electrodes 6 and piezoelectric layers 5 even when the piezoelectric layers are repeatedly displaced. This can prevent interlayer peeling and destruction from occurring between the inner electrodes 6 and piezoelectric layers 5. In particular, this can prevent metals or metal ions from migrating because of the moisture attached to side faces of the piezoelectric element main part 2 when the piezoelectric layers 5 are displaced in a humid atmosphere. As a result, the dielectric breakdown of piezoelectric layers 5 and the like can be kept from occurring.

Figure 3:
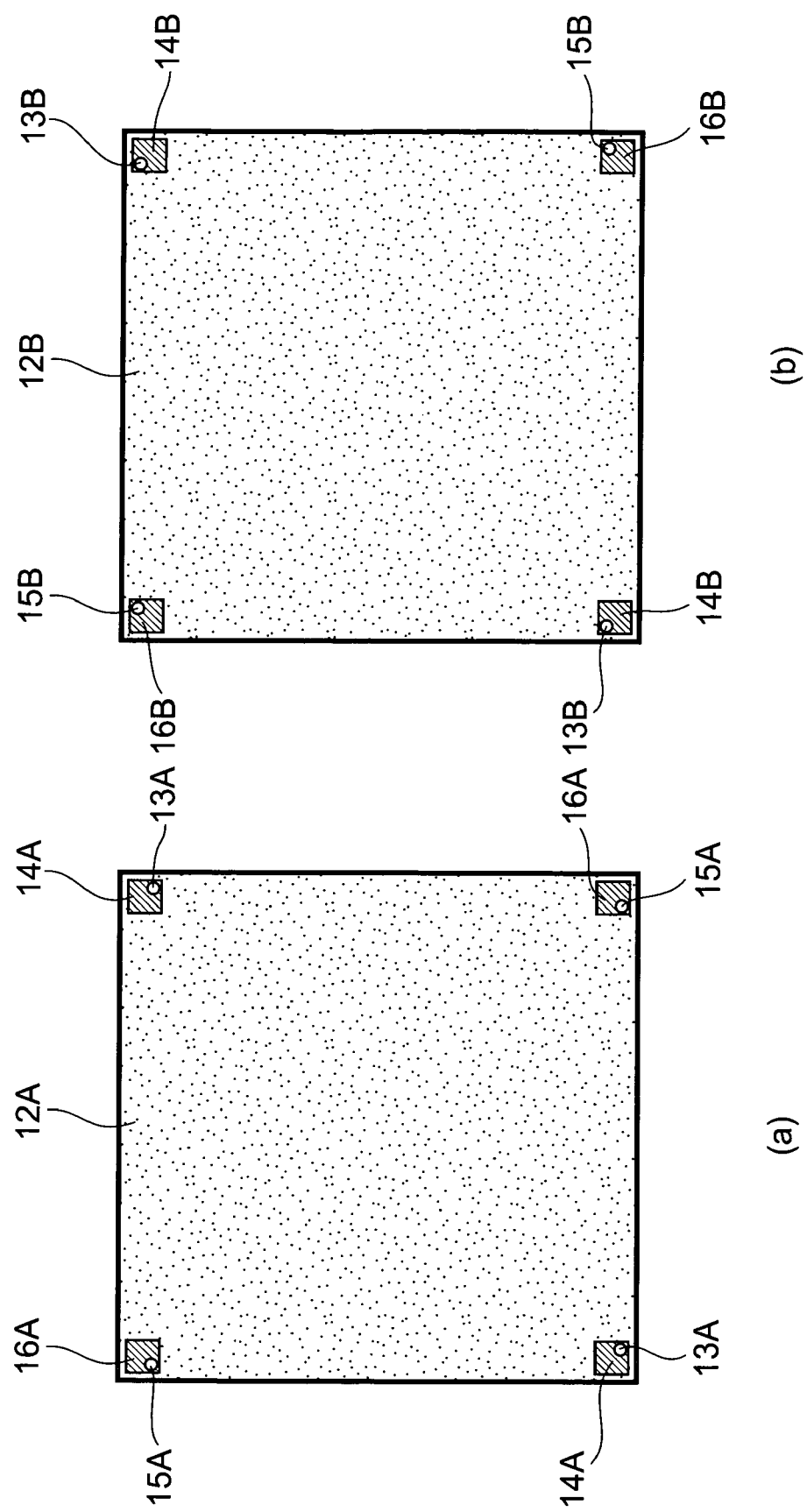
FIG. 3 is a horizontal sectional view of an upper lid part shown in FIG. 1.

The upper lid part 3 disposed on the upper side of the foregoing piezoelectric element main part 2 is constructed by alternately laminating ceramic layers 12A, 12B free of inner electrodes. The ceramic layers 12A, 12B are formed from the same piezoelectric ceramic material as that of the piezoelectric layers 5 mentioned above. As shown in FIG. 3, the ceramic layers 12A, 12B have a quadrangular form as with the piezoelectric layers 5 mentioned above.

As shown in (a) in FIG. 3, one pair of opposing corners in four corners of the ceramic layer 12A are formed with circular through hole electrodes 13A and connecting patterns 14A electrically connected to their corresponding through hole electrodes 13A. The other pair of opposing corners in the ceramic layer 12A are formed with circular through hole electrodes 15A and connecting patterns 16A electrically connected to their corresponding through hole electrodes 15A. The connecting patterns 14A, 16A are the same as the connecting patterns 11A, 11B in terms of size and the like.

As shown in (b) in FIG. 3, among four corners of the ceramic layer 12B, one pair of corners corresponding to the portions where the through hole electrodes 13A and connecting patterns 14A are provided are formed with circular through hole electrodes 13B and connecting patterns 14B electrically connected to the through hole electrodes 13B. The other pair of opposing corners in the ceramic layer 12B, i.e., a pair of corners corresponding to portions where the through hole electrodes 15A and connecting patterns 16A are provided, are formed with circular through hole electrodes 15B and connecting patterns 16B electrically connected to the through hole electrodes 15B. The connecting patterns 14B, 16B are the same as the connecting patterns 11A, 11B in terms of size and the like.

The through hole electrodes 13A in the ceramic layer 12A are formed at positions shifted from the through hole electrodes 13B in the ceramic layer 12B. The through hole electrodes 15A in the ceramic layer 12A are formed at positions shifted from the through hole electrodes 15B in the ceramic layer 12B. Therefore, in the state where the ceramic layers 12A, 12B are alternately laminated, the through hole electrodes 13A, 13B are arranged in a staggered manner with respect to the laminating direction, whereas the through hole electrodes 15A, 15B are arranged in a staggered manner with respect to the laminating direction. In this state, the through hole electrodes 13A, 13B are electrically connected to each other by way of the connecting pattern electrodes 14A, 14B, whereas the through hole electrodes 15A, 15B are electrically connected to each other by way of the connecting pattern electrodes 16A, 16B. As a consequence, the connecting pattern 14B on the uppermost surface of the upper lid part 3 is electrically connected to a plurality of electrodes 6A, whereas the connecting pattern 16B on the uppermost surface of the upper lid part 3 is electrically connected to a plurality of electrodes 6B.

Figure 4:
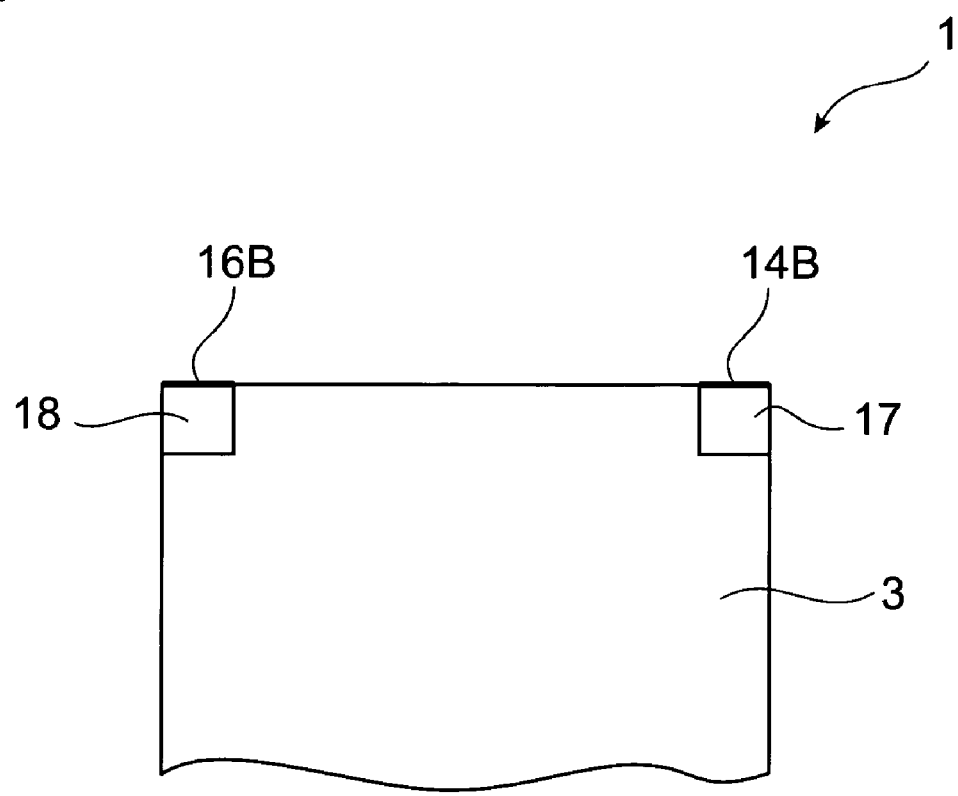
FIG. 4 is a side view of the upper part of the multilayer piezoelectric element shown in FIG. 1.

As shown in FIG. 4, side faces of the upper end portion of the upper lid part 3 are formed with terminal electrodes 17, 18 electrically connected to the connecting patterns 14B, 16B, respectively. The terminal electrodes 17, 18 are provided at each of the four side faces of the upper lid part 3. Leads (not depicted) for applying a voltage are connected to the terminal electrodes 17, 18. The terminal electrodes 17, 18 are formed from a metal material such as Ag, Au, or Cu.

Providing the terminal electrodes 17, 18 makes it possible to displace the piezoelectrically active region S in the piezoelectric layers 5 by applying a voltage between the electrodes 6A, 6B of the piezoelectric element main part 2. Here, the terminal electrodes 17, 18 are not formed on the upper face of the upper lid part 3 but at the upper end portions of the side faces, and thus hardly inhibit the piezoelectric layers 5 from being displaced in the laminating direction.

The lower lid part 4 disposed on the lower side of the piezoelectric element main part 2 is constructed by laminating a plurality of ceramic layers 19 which are totally free of the inner electrodes, through hole electrodes, and connecting patterns.

In the multilayer piezoelectric element 1, the number of piezoelectric layers 5 in the piezoelectric element main part 2 is 350, for example. The ceramic layers 12A, 12B in the upper lid part 3 are provided by 6 each, for example, whereas the number of ceramic layers 19 in the lower lid part 4 is 12, for example. The upper lid part 3 and lower lid part 4 are provided in order to protect the piezoelectrically active region S of the piezoelectric element main part 2 and make it easier to build the multilayer piezoelectric element 1 into an apparatus (not depicted).

A procedure of making the above-mentioned multilayer piezoelectric element 1 will now be explained. First, green sheets to construct the piezoelectric layers 5A, 5B of the piezoelectric element main part 2, green sheets to construct the ceramic layers 12A, 12B of the upper lid part 3, and green sheets to construct the ceramic layers 19 of the lower lid part 4 are formed. Specifically, a piezoelectric ceramic powder mainly composed of PZT (lead zirconate titanate) is prepared; an organic binder/organic solvent, and the like are mixed therewith, so as to make a paste; and green sheets are formed with a predetermined thickness while using a PET film as a carrier film.

Subsequently, the green sheets to construct the piezoelectric layers 5A are formed with electrode parts corresponding to the through hole electrodes 9A, 10A. The green sheets to construct the piezoelectric layers 5B are formed with electrode parts corresponding to the through hole electrodes 9B, 10B. The green sheets to construct the ceramic layers 12A are formed with electrode parts corresponding to the through hole electrodes 13A, 15A. The green sheets to construct the ceramic layers 12B are formed with electrode parts corresponding to the through hole electrodes 13B, 15B. Specifically, predetermined positions of the green sheets are irradiated with laser light from a third-harmonic YAG laser, so as to form through holes. Then, the through holes are filled with a conductive paste by screen printing. The conductive material employed is a metal material in which the ratio of Ag:Pd=7:3, for example. This powder is mixed with an organic binder, an organic solvent, and the like, so as to form a paste.

Subsequently, inner electrode patterns corresponding to the electrodes 6A and the connecting patterns 11A are printed on the green sheets to construct the piezoelectric layers 5A, whereas inner electrode patterns corresponding to the electrodes 6B and the connecting patterns 11B are printed on the green sheets to construct the piezoelectric layers 5B. Specifically, for example, a metal material in which the ratio of Ag:Pd=7:3 is mixed with an organic binder, an organic solvent, and the like, so as to make a paste, with which patterns are formed on the green sheets by screen printing as with the filler for the through holes.

Here, a powder of the same material as that of the ceramic material forming the green sheets may be kneaded into the inner electrode paste such that the inner electrode patterns exhibit a shrinkage ratio slightly greater than that of green sheets at the time of firing which will be explained later. In this case, the shrinkage ratio of the inner electrode patterns at the time of firing can be changed by adjusting the amount of powder kneaded.

Using the same technique as that mentioned above, the connecting patterns 14A, 16A are printed on the green sheets to construct the ceramic layers 12A, and the connecting patterns 14B, 16B are printed on the green sheets to construct the ceramic layers 12B.

Subsequently, a predetermined number of green sheets to construct the ceramic layers 19 in the lower lid part 4 are laminated. Then, a predetermined number of two kinds of green sheets to construct the piezoelectric layers 5A, 5B are alternately laminated thereon. Further, a predetermined number of two kinds of green sheets to construct the ceramic layers 12A, 12B in the upper lid part 3 are alternately laminated thereon.

Subsequently, the laminate of green sheets (hereinafter referred to as laminate green) is pressed at a pressure of about 100 MPa while being heated at about 60° C., whereby the layers of the laminate green are bonded together under pressure. Then, the laminate green is cut into a predetermined size. At the point after cutting, the inner electrode patterns and connecting patterns are exposed to the side faces of the laminate green.

Thereafter, the laminate green is mounted on a setter, and is subjected to degreasing (debindering) for about 10 hours at about 400° C. Then, while the setter mounted with the laminate green is within a closed furnace, the laminate green is fired for about 2 hours at about 1100° C., so as to yield a sintered body. During the firing of the green, the inner electrode patterns retract from the side faces of laminate green because of the difference in their shrinkage ratios. Therefore, after the firing, sufficiently small insulation gaps are secured between the side faces of the laminate green and the inner electrode patterns.

Subsequently, Ag or the like is attached by baking to the side faces in the upper part of the fired laminate green, so as to form the terminal electrodes 17, 18 to connect with leads. For forming the terminal electrodes 17, 18, not only baking but also techniques such as sputtering and electroless plating can be used.

Thereafter, polarization is effected. In the polarization, for example, a voltage of 75 $V_{dc}$ is applied for about 3 minutes in an environment at a temperature of about 120° C. such that the electric field intensity becomes 2 kV/mm. This yields a multilayer piezoelectric element 1 which functions as a piezoelectric actuator.

In this embodiment, as explained in the foregoing, each of the piezoelectric layers 5A is formed with two through hole electrodes 9A connecting the electrodes 6A to each other and two through hole electrodes 10A connecting the electrodes 6B to each other. Each of the piezoelectric layers 5B is formed with two through hole electrodes 9B connecting the electrodes 6B to each other and two through hole electrodes 10B connecting the electrodes 6A to each other. The piezoelectric layers 5A and 5B are alternately laminated. These enhance the in-plane uniformity of the electric field distribution occurring between the electrodes 6A, 6B as mentioned above, thereby improving the in-plane uniformity in the amount of displacement of the multilayer piezoelectric element 1. Therefore, the multilayer piezoelectric element 1 can easily be displaced in desirable directions.

In this embodiment, the through hole electrodes 9A, 10A are formed at corners of the piezoelectric layer 5A, while the through hole electrodes 9B, 10B are formed at corners of the piezoelectric layer 5B. Since the corners of the piezoelectric layers 5A, 5B are positioned on the outside of the piezoelectrically active region S, the through hole electrodes 9A to 10B do not restrain the multilayer piezoelectric element 1 from being displaced. This secures the piezoelectrically active region S with a sufficient space, whereby the multilayer piezoelectric element 1 can increase its amount of displacement. Since the through hole electrodes 9A to 10B themselves are hardly displaced, the through hole electrodes 9A to 10B can reliably be kept from breaking when the multilayer piezoelectric element 1 is displaced.

The present invention is not restricted to the above-mentioned embodiment. For example, though two through hole electrodes for connecting the electrodes 6A to each other and two through hole electrodes for connecting the electrodes 6B to each other are formed in each piezoelectric layer 5 in the above-mentioned embodiment, the number of through hole electrodes is not limited thereto. It will be sufficient if there are a plurality of through hole electrodes for connecting the electrodes 6A to each other and a plurality of through hole electrodes for connecting the electrodes 6B to each other. Though portions where through hole electrodes are formed are not restricted in particular, it will be preferred if a plurality of through hole electrodes are formed at end portions of each piezoelectric layer 5 or in the piezoelectric layer 5 so as to hold the inner electrode 6 therebetween as in this embodiment for the homogenization, enhancement, and the like of the amount of displacement in the multilayer piezoelectric element 1.

Though the above-mentioned embodiment is configured such that the through hole electrodes are arranged in a staggered manner with respect to the laminating direction of the piezoelectric layers 5 laminated, this is not restrictive in particular. For example, without providing the piezoelectric layers 5 with connecting patterns, the upper and lower through hole electrodes may directly be connected to each other. The through hole electrodes are not limited to the circular forms mentioned above, but may be elliptical, polygonal, or the like. The through hole electrodes may be constituted by the conductive material filling the through holes formed in the piezoelectric layers as in the above-mentioned embodiment, or a conductive material disposed along wall faces defining the through holes.

Forms, sizes, and the like of the piezoelectric layers and inner electrodes are not limited to those of the above-mentioned embodiment in particular. For example, the inner electrodes may have a circular or elongated form.

Though the multilayer electronic component in accordance with the above-mentioned embodiment is a multilayer piezoelectric element, the multilayer electronic component of the present invention can also be employed in multilayer dielectric elements such as multilayer ceramic capacitors formed by alternately laminating dielectric layers and inner electrodes. This enhances the in-plane uniformity in the electric field distribution occurring in the dielectric layers, and thus can improve the in-plane uniformity in electrostatic charge distribution.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer electronic component constructed by alternately laminating a matrix layer and an inner electrode;
   wherein the multilayer electronic component includes a plurality of matrix layers and a plurality of inner electrodes;
   wherein the plurality of inner electrodes include a first electrode and a second electrode opposing the first electrode with the matrix layer interposed therebetween;
   wherein each of the first electrodes includes a plurality of first through hole electrodes, and each of the second electrodes includes a plurality of second through hole electrodes;
   wherein each of the matrix layers is formed with the plurality of first through hole electrodes and the plurality of second through hole electrodes; and
   wherein the plurality of inner electrodes, the plurality of first through hole electrodes, and the plurality of second through hole electrodes are disposed so as not to be exposed to side faces of the multilayer electronic component;
   wherein the plurality of matrix layers include first and second matrix layers alternately laminated with the inner electrodes interposed therebetween;
   wherein the first matrix layer includes a first electrode forming region having a surface formed with the first electrode and the first through hole electrodes formed therein, and a plurality of first connection regions respectively formed with the second through hole electrodes;
   wherein the second matrix layer includes a second electrode forming region having a surface formed with the second electrode and the second through hole electrodes formed therein, and a plurality of second connection regions respectively formed with the first through hole electrodes;
   wherein a first connecting pattern electrically connected to the second through hole electrode is formed on the surface of each of the first connection regions in the first matrix layer;
      wherein a second connecting pattern electrically connected to the first through hole electrode is formed on the surface of each of the second connection regions in the second matrix layer;
      wherein the plurality of first through hole electrodes are arranged in a staggered manner with respect to a laminating direction of the matrix layers;
      wherein the plurality of second through hole electrodes are arranged in a staggered manner with respect to the laminating direction of the matrix layers;
      wherein the first connecting pattern and the second connecting patter have a quadrangular form;
      wherein the first through hole electrodes that are adjacent in the lamination direction of the matrix layers and the inner electrodes are mutually disposed at different corners of the second connecting pattern; and
      wherein the second through hole electrodes that are adjacent in the lamination direction of the matrix layers and the inner electrodes are mutually disposed at different corners of the first connecting pattern.

2. The multilayer electronic component according to claim 1, wherein the plurality of first through hole electrodes are formed in the matrix layer so as to hold a center of the matrix layer therebetween; and
   wherein the plurality of second through hole electrodes are formed in the matrix layer so as to hold the center of the matrix layer therebetween at respective positions different from the first through hole electrodes.

3. The multilayer electronic component according to claim 1, wherein the first through hole electrodes formed in the first electrode forming region are located at portions corresponding to the plurality of second connection regions; and
   wherein the second through hole electrodes formed in the second electrode forming region are located at portions corresponding to the plurality of first connection regions.

4. The multilayer electronic component according to claim 1, wherein the plurality of first connection regions are provided in the first matrix layer so as to hold the first electrode forming region therebetween; and
   wherein the plurality of second connection regions are provided in the second matrix layer so as to hold the second electrode forming region at a position different from the first connection regions.

5. The multilayer electronic component according to claim 1, wherein the first electrode forming region and first connection regions are formed on the inside of a periphery of the first matrix layer; and wherein the second electrode forming region and second connection regions are formed on the inside of a periphery of the second matrix layer.

6. The multilayer electronic component according to claim 1, wherein the first electrode forming region has an area greater than the total area of the plurality of first connection regions; and wherein the second electrode forming region has an area greater than the total area of the plurality of second connection regions.

7. The multilayer electronic component according to claim 6, wherein the plurality of first connection regions are formed at an end portion of the first matrix layer; and wherein the plurality of second connection regions are formed at an end portion of the second matrix layer.

8. The multilayer electronic component according to claim 1, wherein the matrix layer has a quadrangular form; wherein the plurality of first through hole electrodes are formed at one pair of corners of the matrix layer opposing each other by way of a center of the matrix layer; and wherein the plurality of second through hole electrodes are formed at the other pair of corners opposing each other by way of the center of the matrix layer.

9. The multilayer electronic component according to claim 5, wherein the matrix layers have a square form;

wherein a ratio ($L/L_0$) between a distance (L) from the side face of the matrix layer to the first electrode forming region and the first connection regions and a length ($L_0$) of one side of the matrix layer is greater than 0% but not greater than 3%; and wherein a ration ($L/L_0$) between a distance (L) from the side face of the matrix layer to the second electrode forming region and the second connection regions and the length ($L_0$) of one side of the matrix layer is greater than 0% but not greater than 3%.

* * * * *